United States Patent
Endoh et al.

(10) Patent No.: US 7,132,608 B2
(45) Date of Patent: Nov. 7, 2006

(54) ELECTRONIC DEVICE HAVING SIDE ELECTRODE, METHOD OF MANUFACTURING THE SAME, AND APPARATUS USING THE SAME

(75) Inventors: Shinichi Endoh, Mizuho (JP); Masaharu Iwasa, Ichinomiya (JP); Hideyuki Ito, Mizuho (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 11/052,817

(22) Filed: Feb. 9, 2005

(65) Prior Publication Data

US 2005/0224254 A1 Oct. 13, 2005

(30) Foreign Application Priority Data

Apr. 13, 2004 (JP) ............................ 2004-117602
Jan. 20, 2005 (JP) ............................ 2005-012300

(51) Int. Cl.
*H05K 1/03* (2006.01)
(52) U.S. Cl. ..................... 174/255; 174/257; 174/260
(58) Field of Classification Search ............... 174/255, 174/260, 261, 257, 256; 361/813
See application file for complete search history.

(56) References Cited

U.S. PATENT DOCUMENTS 5,248,854 A * 9/1993 Kudoh et al. ............... 174/261
5,774,342 A * 6/1998 Brandenburg et al. ...... 361/774
5,886,877 A * 3/1999 Shingai et al. .............. 361/768
6,303,876 B1 * 10/2001 Miyazaki .................... 174/260

FOREIGN PATENT DOCUMENTS

JP 2002-252534 A 9/2002

* cited by examiner

*Primary Examiner*—Ishwar (I. B.) Patel
(74) *Attorney, Agent, or Firm*—McDermott Will & Emery LLP

(57) ABSTRACT

A film having a recess provided in a surface of the film is provided. The recess included a first portion and a second portion connected with the first portion. The second portion is deeper than the first portion. The recess in the film is filled with a conductive paste so as to fill the first portion and the second portion of the recess with a first portion and a second portion of the conductive paste, respectively. Then, the surface of the film is attached onto a surface of a substrate. The conductive paste is transferred to the surface of the substrate by removing the film from the substrate so as to transfer the first portion and the second portion of the conductive paste to the surface of the substrate. The transferred first portion and the transferred second portion of the conductive paste are baked to provide a first portion and the second portion of a conductor pattern, respectively. An insulating layer is provided on the conductor pattern. Then, the substrate, the insulating layer, and the conductor pattern are cut along a first border extending across the second portion of the conductor pattern, thus providing an electronic device. In this method, the side electrode is formed simultaneously to the cutting of the substrate.

7 Claims, 18 Drawing Sheets

US 7,132,608 B2

ELECTRONIC DEVICE HAVING SIDE ELECTRODE, METHOD OF MANUFACTURING THE SAME, AND APPARATUS USING THE SAME

FIELD OF THE INVENTION

The present invention relates to an electronic device having a side electrode, a method of manufacturing the electronic device, and an apparatus using the electronic device.

BACKGROUND OF THE INVENTION

A surface-mount electronic device may be manufactured by the following processes. FIG. 22 illustrates the processes. A wiring pattern is provided on a substrate 1 having a sheet shape to provide chip substrates 2 arranged like a grid. The substrate 1 is divided along borders 3 into the chip substrates 2. Then, a side electrode is provided on a separated side, i.e., a side surface of the chip substrate 2, providing a surface-mount electronic device.

FIG. 23 illustrates a method of manufacturing the conventional surface-mount electronic device disclosed in Japanese Patent Laid-Open Publication No.2002-252534. A Recess is formed in a polyimide film with laser beam to provide an intaglio (Step 4). The recess in the film is filled with electrically-conductive paste by a squeegee (Step 5). The conductive paste filled at Step 5 is dried (Step 6). The film having the recess filled with the conductive paste is placed over a substrate 1 to transfer the conductive paste onto the substrate 1 (Step 7). The film is then removed from the substrate 1 (Step 8). The substrate 1 having the conductive paste transferred thereon is heated (Step 9) and baked at about 850° C. (Step 10). The baking at Step 10 has the conductive paste serve as a conductor pattern. An insulating layer is provided on the conductor pattern and the substrate 1 (Step 11). The substrate 1 having the insulating layer thereon is divided along borders 3 into chip substrates 2 (Step 12). A silver material is applied on a side of the chip substrate 2, providing a side electrode.

FIG. 24 is a perspective view of the conventional surface-mount electronic device 18 manufactured by the method shown in FIG. 23. Conductor pattern 16 is provided on substrate 15 corresponding to the chip substrate 2. An insulating layer 17 is provided on conductor pattern 16 and substrate 15. Conductor pattern 16 is connected to side electrode 14 provided on side 18A of electronic device 18.

SUMMARY OF THE INVENTION

A film having a recess provided in a surface of the film is provided. The recess included a first portion and a second portion connected with the first portion. The second portion is deeper than the first portion. The recess in the film is filled with a conductive paste so as to fill the first portion and the second portion of the recess with a first portion and a second portion of the conductive paste, respectively. Then, the surface of the film is attached onto a surface of a substrate. The conductive paste is transferred to the surface of the substrate by removing the film from the substrate so as to transfer the first portion and the second portion of the conductive paste to the surface of the substrate. The transferred first portion and the transferred second portion of the conductive paste are baked to provide a first portion and the second portion of a conductor pattern, respectively. An insulating layer is provided on the conductor pattern. Then, the substrate, the insulating layer, and the conductor pattern are cut along a first border extending across the second portion of the conductor pattern, thus providing an electronic device.

In this method, the side electrode is formed simultaneously to the cutting of the substrate.

DETAILED DESCRIPTION OF THE PREFERRED EMBODIMENTS

Exemplary Embodiment 1

Figure 1:
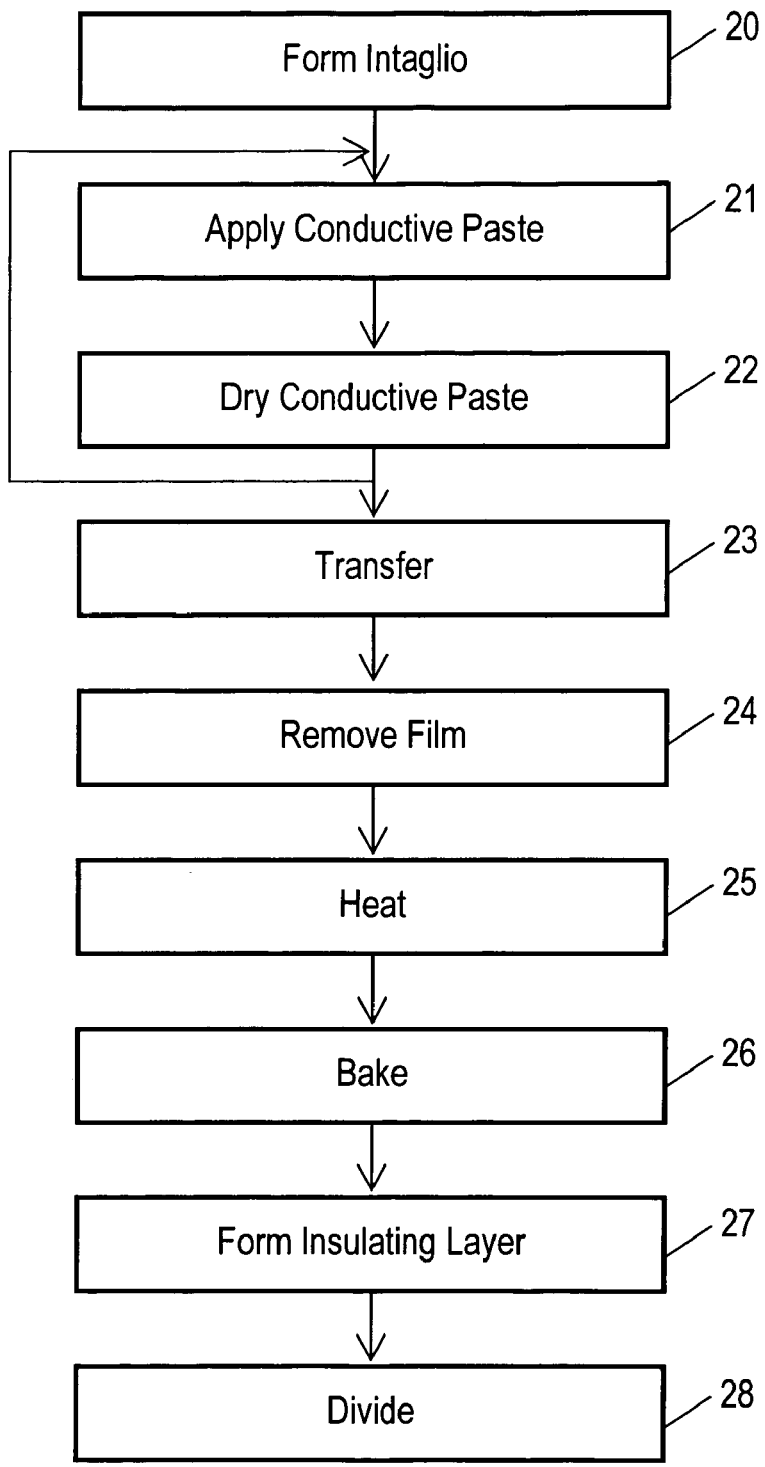
FIG. 1 illustrates a method of manufacturing a surface-mount electronic device according to Exemplary Embodiment 1 of the present invention.
Figure 2:
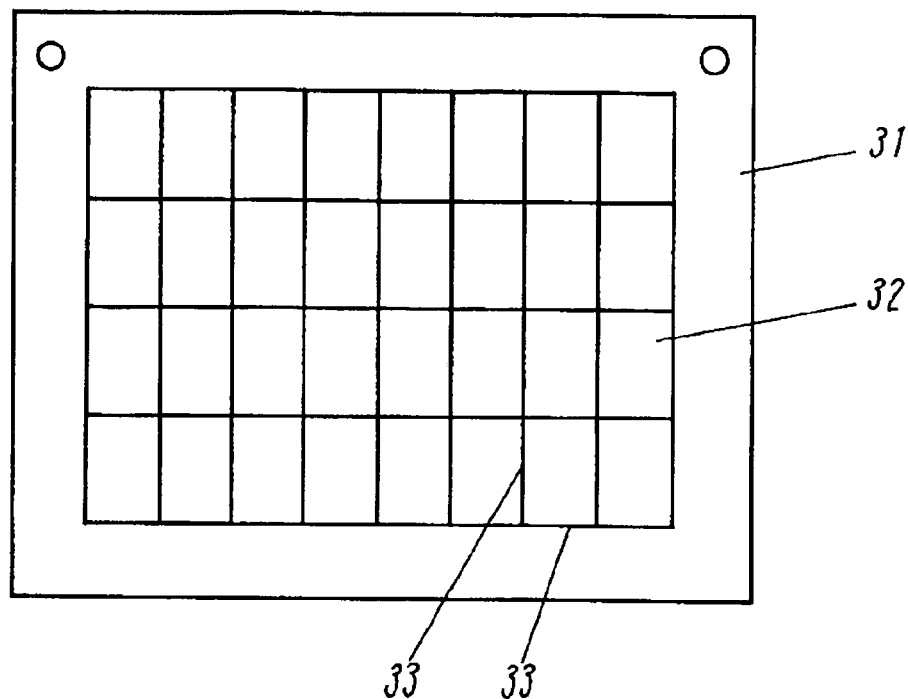
FIG. 2 is a plan view of a substrate for providing the electronic device according to Embodiment 1.

FIG. 1 illustrates processes in a method of manufacturing a surface-mount electronic device according to Exemplary Embodiment 1 of the present invention. FIG. 2 is a plan view of a substrate to be provided with the electronic device of Embodiment 1. A recess is formed in a film by laser beam, providing an intaglio (Step 20). The recess in the film is filled with an electrically-conductive paste (Step 21). The conductive paste is dried (Step 22). The filling of the paste at Step 21 and the drying of the paste at Step 22 may be repeated a predetermined number of times. The film having the recess filled with the conductive paste is attached onto a substrate coated with an adhesive, and then, pressed while heated (Step 23). Then, the film is removed from the substrate, hence transferring the conductive paste on the substrate (Step 24). The substrate having the conductive paste thereon is heated (Step 25), and the conductive paste is baked (Step 26), providing an conductor pattern on the substrate. An insulating layer is formed on the conductor pattern and the substrate (Step 27). The substrate having the insulating layer thereon is divided into chip substrates along a border between the chip substrates by dicing (Step 28). As shown in FIG. 2, chip substrates 32 are formed in substrate 31 having a sheet shape. Substrate 31 is divided into chip substrates 32 along border 33 between chip substrates 32 at Step 28 shown in FIG. 1, providing the chip substrates 32 each serving as the surface-mount electronic device. The border 33 defines a side surface of chip substrate 32.

The processes shown in FIG. 1 of the method of manufacturing the electronic device according to Embodiment 1 will be described in more detail.

Figure 3:
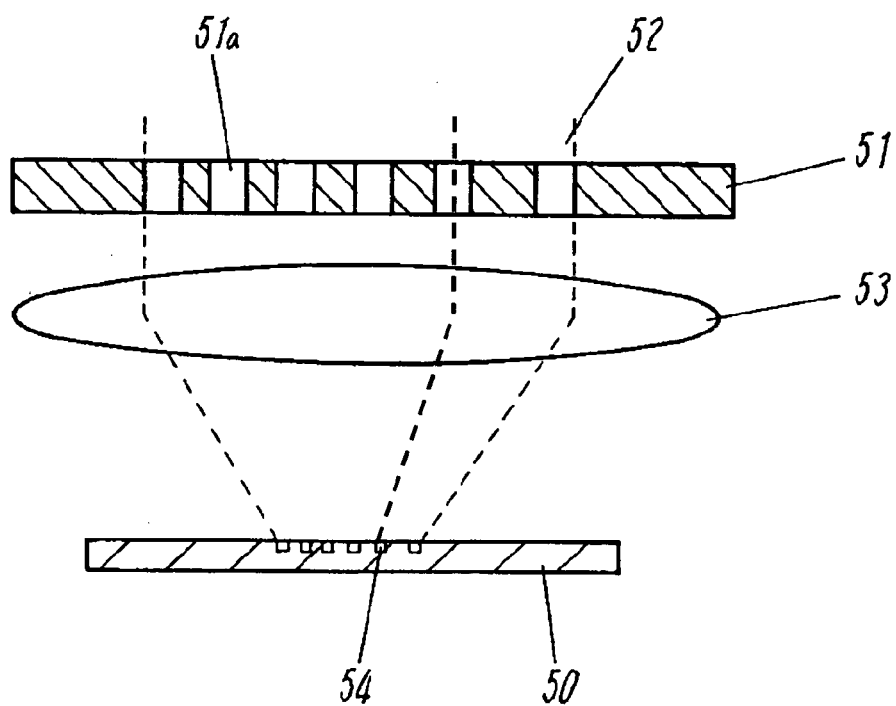
FIG. 3 illustrates a method of making an intaglio for manufacturing the electronic devices according to Embodiment 1.

FIG. 3 illustrates a process for providing the recess in the film at Step 20 shown in FIG. 1. Film 50 is made of polyimide having a thickness of 125 μm. Chrome mask 50 is placed over film 50. Chrome mask 51 has aperture 51a formed therein. Lens 53 is positioned between chrome mask 51 and film 50. Excimer laser 52 is emitted from above to chrome mask 51. Excimer laser 52 runs through aperture 51a in mask 51 and lens 52, and forms recess 54 corresponding to aperture 51a in film 50.

Figure 4:
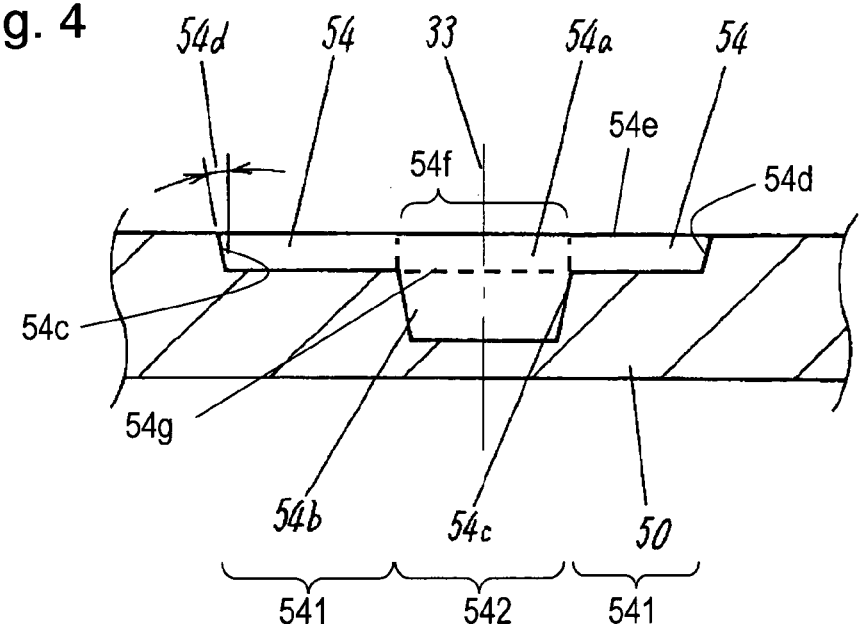
FIG. 4 is a cross sectional view of a recess formed in the intaglio for manufacturing the electronic device according to Embodiment 1.

FIG. 4 is a cross sectional view of recess 54. A side wall of recess 54 in film 50 flares at angle 54d ranging substantially from 2° to 6° toward opening 54e where recess 54 opens. This structure allows the conductive paste filled at Step 24 to be easily removed from the recess 54, hence providing the conductor pattern precisely.

Recess 54b is further provided at portion 54f of recess 54 at border 33. That is, recess 54a having a depth equal to that of recess 54 is formed at portion 54f of recess 54, and further, recess 54b is formed at bottom 54g of recess 54a. Recess 54a and recess 54b form electrode recess 54c. In other words, recess 54 includes shallow portion 541 and deep portion 542 deeper than portion 541 and connected with portion 541.

Walls of recesses 54, 54a, 54b, and 54c in film 50 may be coated with carbon fluoride material to provide molecular layer of the carbon fluoride material. This layer allows the conductive paste to be easily removed from recesses 54, 54a, 54b, and 54c and to provide the conductor pattern precisely.

Figure 5A:
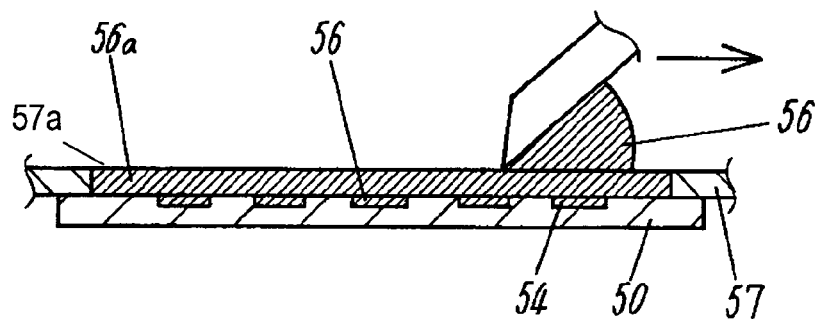
FIGS. 5A to 5C are cross sectional views of the electronic device for illustrating a method of manufacturing the device according to Embodiment 1.
Figure 5B:
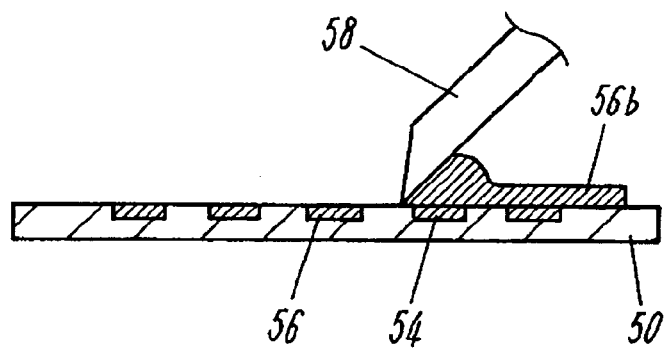
Figure 5C:
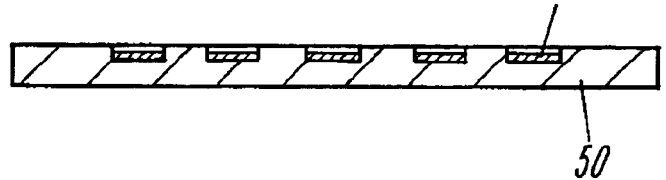

FIGS. 5A to 5C are cross sectional views of film 50 having recess 54 filled with conductive paste at Step 21 shown in FIG. 1.

As shown in FIG. 5A, screen 57 having a thickness of 100 μm and having aperture 57a is placed on film 50. Conductive paste 56 is applied through aperture 57a onto film 50 by screen printing. Thereby, recess 54 in film 50 is filled with conductive paste 56, and layer 56a of conductive paste 56 having a thickness of about 100 μm is formed on film 50. Screen 57 is made of stainless steel. Aperture 57a has a size greater than the entire area provided with recess 54, and recess 54 is thoroughly filled with conductive paste 56. Film 50 is then spun with a centrifugal machine so that the conductive paste 56 distributes to the entire area of recess 54. The centrifugal machine eliminates tiny bubbles which may be developed in conductive paste 56 during the filling.

Then, as shown in FIG. 5B, unnecessary conductive paste 56a other than conductive paste 56 filling recess 54 is removed off from film 50 with squeegee 58.

Then, conductive paste 56 in recess 54 is dried at a temperature such that a solvent contained in conductive paste 56 evaporates but does not deteriorate (Step 22 shown in FIG. 1). The solvent in conductive paste 56 according to Embodiment 1 employs alcohol solvent, such as isopropyl alcohol. Conductive paste 56 includes mainly about 60 wt. % of silver powder, about 38 wt. % of the solvent, and about 2 wt. % of binder. Conductive paste 56 can be dried preferably at about 150° C.

After conductive paste 56 containing about 38 wt. % of the solvent is dried, the paste has a volume decreases by the volume of the solvent, as shown in FIG. 5C. For compensation, another conductive paste 56 is applied into the recess 56 (Step 21 shown in FIG. 1) and dried again (Step 22 in FIG. 1). The applying of the paste at Step 21 and the drying of the paste at Step 22 may be repeated several times (five times according to Embodiment 1) until the recess 54 is fully filled with conductive paste 56.

According to Embodiment 1, the concentration of the silver powder in conductive paste 56 is adjusted to about 60 wt. % for easily printing the paste. The more the concentration of the silver powder, the less the number of the operations at Steps 21 and 22 may be repeated.

Figure 6A:
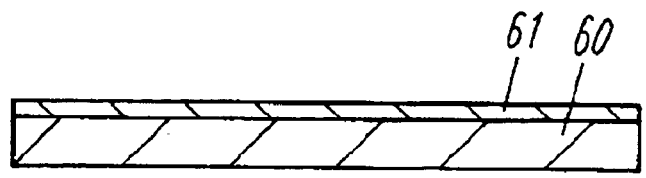
FIGS. 6A and 6B are cross sectional views of the electronic device for illustrating the method for manufacturing the device according to Embodiment 1.
Figure 6B:
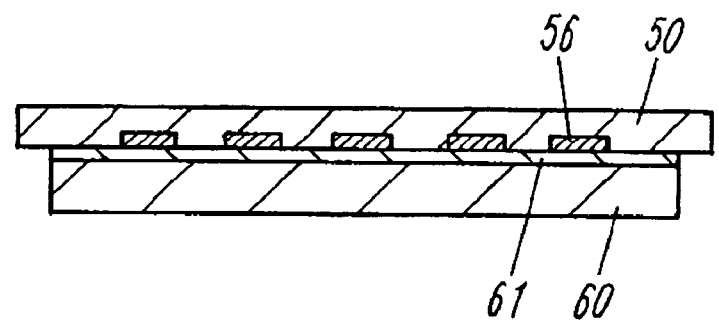

FIGS. 6A and 6B are cross sectional views of film 50 having recess 50 filled with dried conductive paste 56 and placed upside down on substrate 60.

As shown in FIG. 6A, substrate 60 is made of alumina and has a surface coated with adhesive layer 61 made of thermoset adhesive, such as polyvinyl butylal (PVB) resin. For example, substrate 60 is immersed into mixture liquid of acetone and toluene including the PVB resin dissolving therein. Substrate 60 is dried and has adhesive layer 61 deposited thereon. The mixture liquid containing acetone, toluene, and the PVB resin can naturally be dried at a room temperature.

Then, as shown in FIG. 6B, film 50 having recess 54 filled with conductive paste 56 onto adhesive layer 61 on alumina substrate 60. The alumina substrate 60 with film 50 is placed between rubber plates (not shown) to be pressed by the plates during heated. The heating causes the adhesive layer 61 to melt and penetrate into conductive paste 56 in recess 54, so that the PVB resin in adhesive layer 61 is mixed with conductive paste 56.

The heating is executed at a temperature higher than a glass transition temperature for preventing film 50 from separating from the alumina substrate 60 around adhesive layer 61. The temperature for the heating is lower than a temperature at which the degree of polymerization of the PVB resin becomes zero in order to prevent voids on adhesive layer 61. The voids may be gas, such as steam generated by fluctuation of molecular bonding in the PVB resin. There is no way to allow gas generated in recess 54 to leak, and the gas remain in conductive paste 56.

After adhesive layer 61 containing the PVB resin is heated at 175° C. in an atmosphere for about twenty minutes, the degree of polymerization of the PVB resin becomes zero. The temperature for the heating according to Embodiment 1 is low, 140° C., since the fluctuation of the molecular bonding in the PVB resin steadily proceeds and generates undesired gas even at a temperature lower than 175° C. This process provides the conductor pattern precisely with no defect in its shape.

Conductive paste 56 on adhesive layer 61 is cooled and cured, and is accordingly bonded to substrate 60 securely. The cooling is executed until the temperature of the adhesive layer 61 becomes lower than the glass transition temperature. If the temperature remains not lower than the glass transition temperature, the PVB resin in adhesive layer 61 may not be cured completely. When film 50 is transported, the film may be separated from substrate 60.

Figure 7:
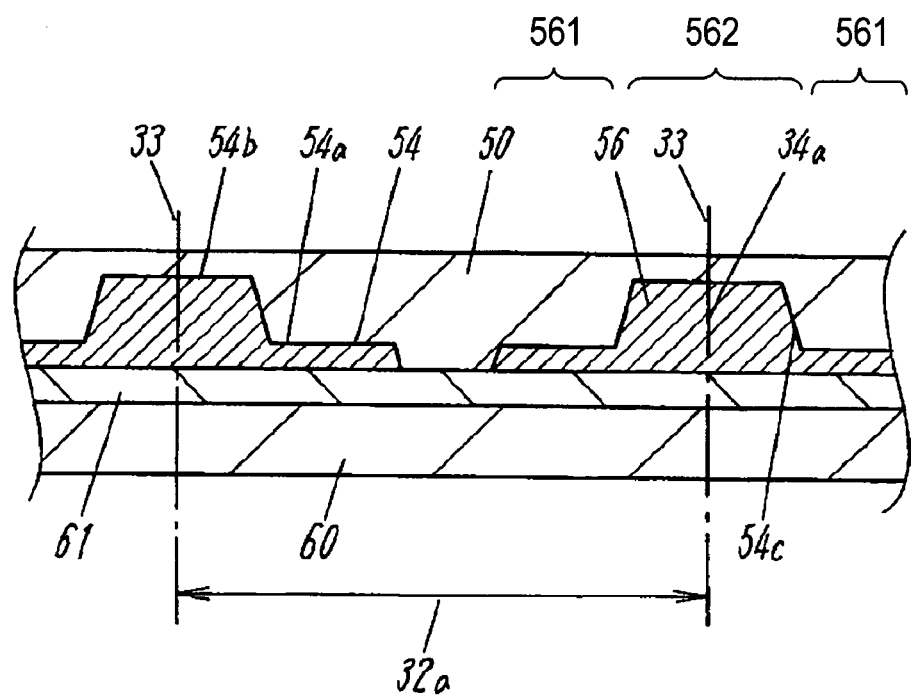
FIG. 7 is a cross sectional view of the electronic device for illustrating the method of manufacturing the device according to Embodiment 1.
Figure 23:
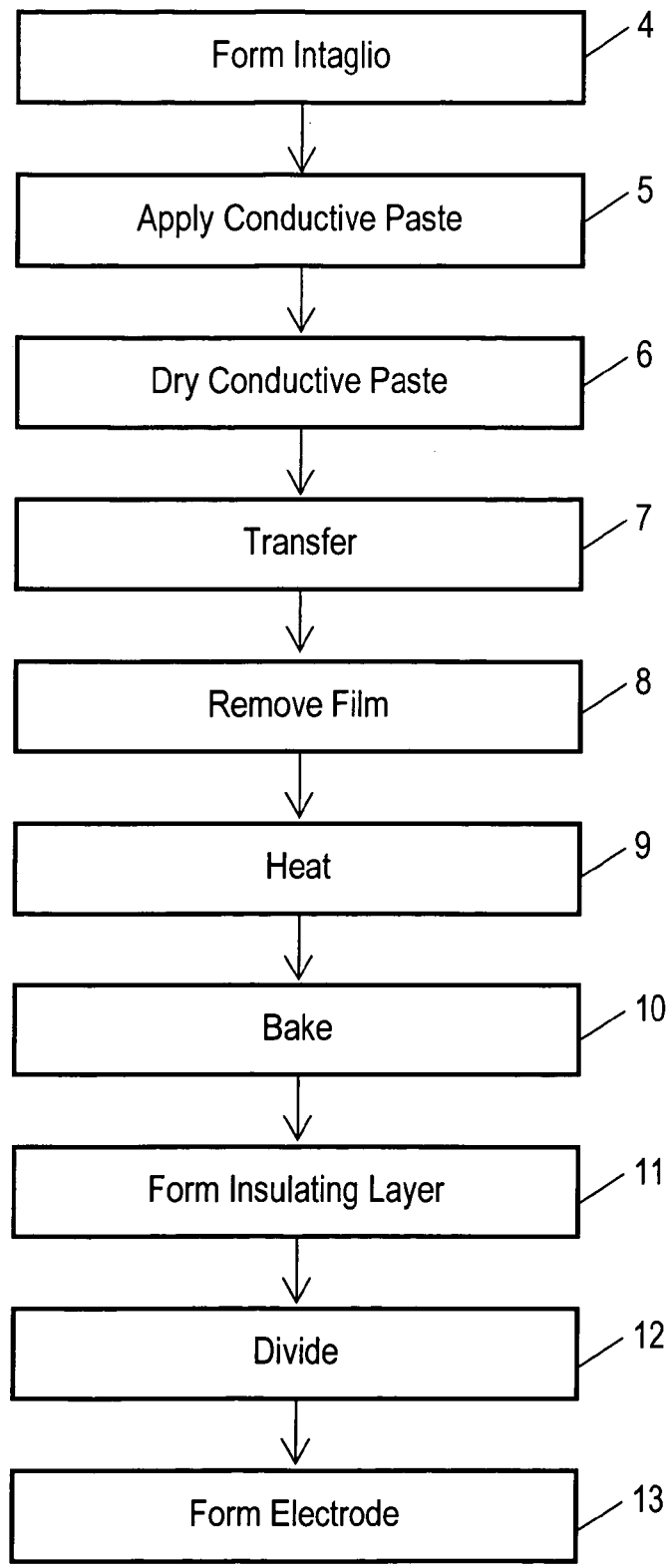
FIG. 23 illustrates processes for manufacturing the conventional electronic device.
Figure 24:
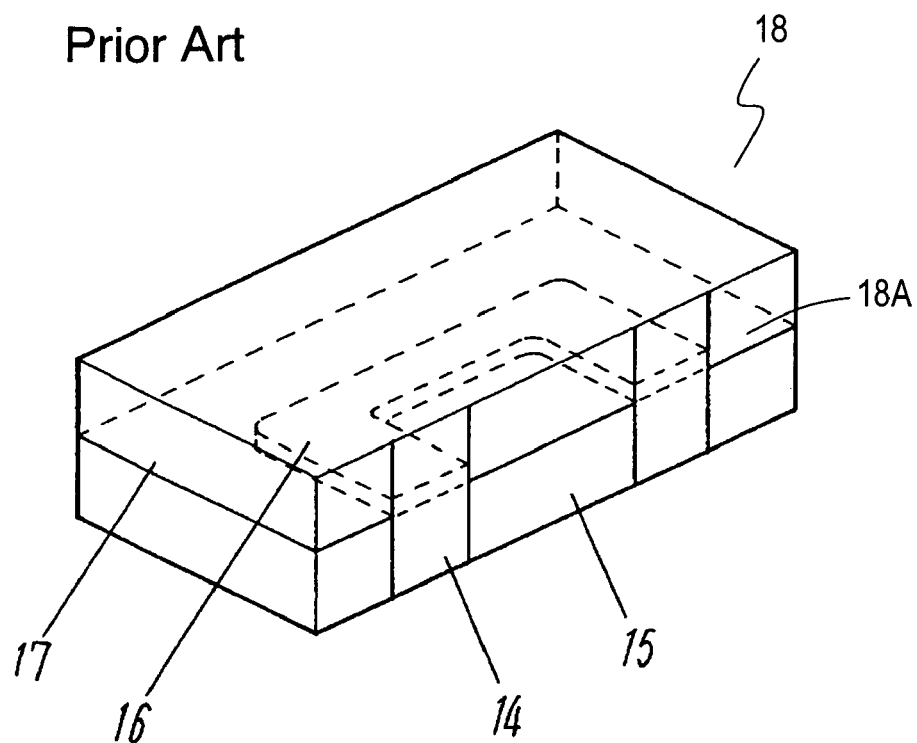
FIG. 24 is a perspective view of the conventional electronic device.

FIG. 7 is a cross sectional view of film 50 filled with conductive paste 56 and attached onto substrate 60 between two borders 33 adjacent to each other. Area 32a between borders 33 corresponds to chip substrate 32 divided at Step 28 in FIG. 1. Electrode recess 54c including recesses 54a and 54b is formed at a position corresponding to side surface 34a of chip substrate 32. Electrode recess 54c is filled with conductive paste 56. Electrode recess 54c is portion 542 of recess 54 shown in FIG. 4. Border 33 extends across electrode recess 54c, portion 542. Conductive paste 56 includes portions 561 and 562 corresponding to portions 541 and 542 of recess 54, respectively. Portion 542 of conductive paste 56 filling electrode recess 54c is exposed when substrate 60 is divided along border 33 at Step 28, thus serving as side electrode 34 of chip substrate 32. That is, side electrode 34 is formed simultaneously to the dividing of substrate 60 into chip substrates 32. Thus, a process of forming a side electrode of a conventional surface-mount electronic device at Step 13 shown in FIG. 23 is eliminated.

Figure 8:
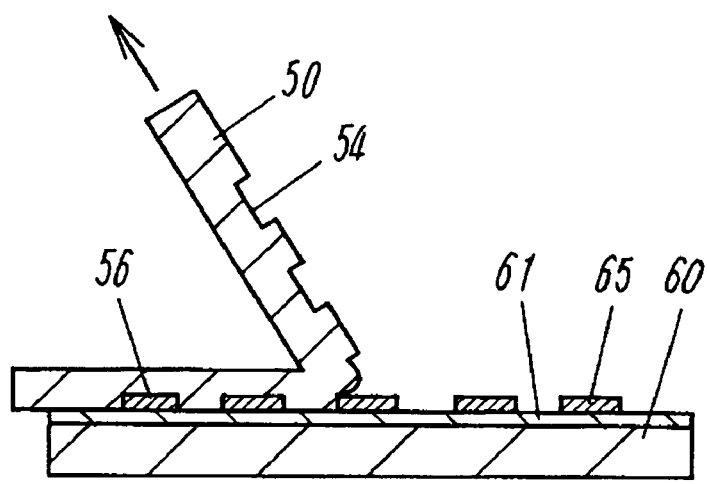
FIG. 8 is a cross sectional view of the electronic device for illustrating the method of manufacturing the device according to Embodiment 1.

FIG. 8 is a cross sectional view of substrate 60 having film 50 removed off from substrate 60 at Step 24 shown in FIG. 1. As film 50 is removed from substrate 60, conductive paste 56 in recess 54 is left as electrical conductor pattern 65 on substrate 60. Conductor pattern 65 corresponding to aperture 51a of chrome mask 51 is transferred on substrate 60.

Figure 9:
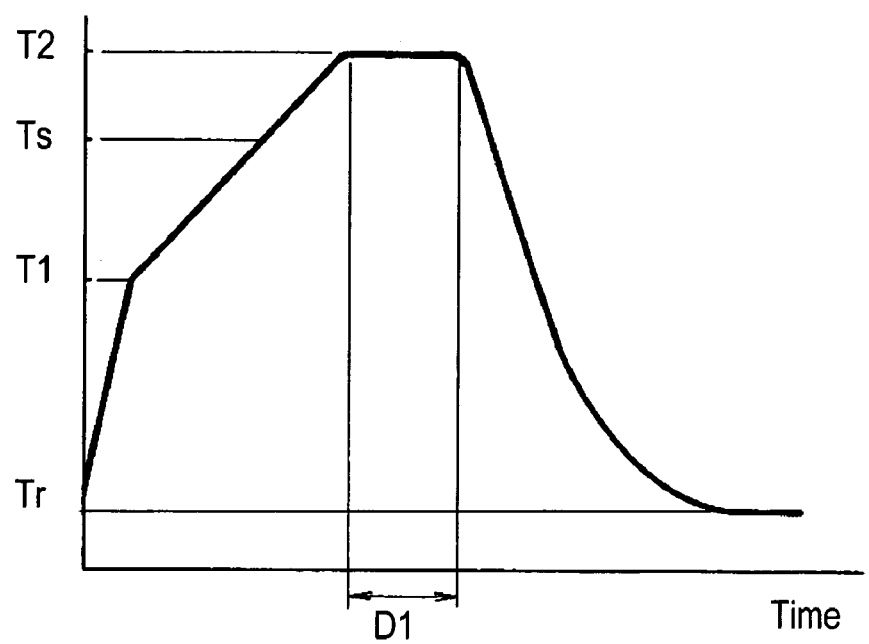
FIG. 9 is a temperature profile in the method of manufacturing the electronic device according to Embodiment 1.

Then, conductive paste 56 on substrate 60 is heated at Step 25 shown in FIG. 1. FIG. 9 illustrates a temperature profile during the heating in which the vertical axis represents a temperature and the horizontal axis. represents time. The heating at Step 25 shown in FIG. 1 is executed until the degree of polymerization of the PVB resin in adhesive layer 61 becomes about zero. As the PVB resin is further heated, decomposition of the resin is accelerated. Oxygen and hydrogen are accordingly removed as gas, such as steam, from the PVB resin in adhesive layer 61, having carbon molecules remain in the resin. This reaction changes the color of adhesive layer 61 into brown, hardens layer 61, and reduces the weight of layer 61. When the PVB resin in adhesive layer 61 is heated at 175° C. in atmosphere for substantially twenty minutes, the degree of polymerization in the resin becomes zero.

A temperature rise during the heating is preferably small from about 61° C., the glass transition temperature of the PVB resin, until the degree of polymerization of the resin becomes zero. The temperature rise during the heating of the PVB resin is determined to be small particularly near softening temperature Ts (147° C.) of the PVB resin.

According to Embodiment 1, substrate 60 is heated from room temperature Tr to temperature T1 at a rate of 16° C./min, and then, the rate is decreased. When the temperature of substrate 60 reaches temperature T2, the rate is further decreased to abut zero, and the substrate 60 is heated for duration D1. According to Embodiment 1, temperature T1 is about 95° C. while temperature T2 is about 175° C. Duration D1 is about 25 minutes. While substrate 60 is heated at temperature T2 for duration D1, the polymerizing degree of the PVB resin decreases to zero and decomposes rapidly.

According to the temperature profile shown in FIG. 9, the maximum temperature is temperature T2, about 175° C. Conductive paste 56 may contain copper powder instead of silver powder, while the copper powder is hardly oxidized at the maximum temperature. Substrate 60 having conductive paste 56 of copper powder transferred thereon is heated in the common atmosphere at Step 25, and therefore, it is not necessary to heat substrate 60 in expensive inactive gas atmosphere, such as nitrogen atmosphere, thus allowing the surface-mount electronic devices to be manufactured inexpensively.

The baking at Step 26 shown in FIG. 1 will be described. The baking sinters the silver powder of conductive paste 56 on substrate 60 at a temperature of about 850° C. after substrate 60 is heated at Step 25. The PVB resin in adhesive layer 61 is incinerated to carbon and water (steam) at a temperature of about 400° C. Accordingly, conductive paste 56 is securely fixed on almina substrate 60 due to anchoring effect, thus providing the substrate with conductor pattern 65 thereon.

Figure 10A:
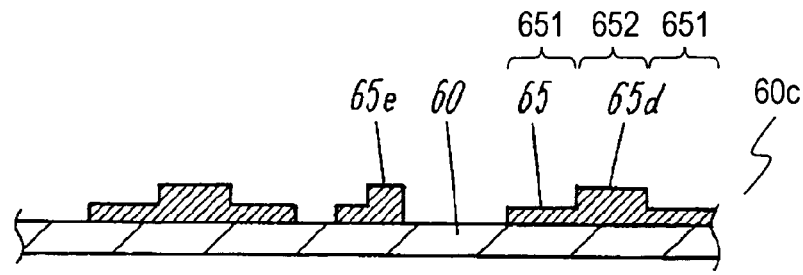
FIGS. 10A to 10C are cross sectional views of the electronic device for illustrating the method of manufacturing the device according to Embodiment 1.
Figure 10B:
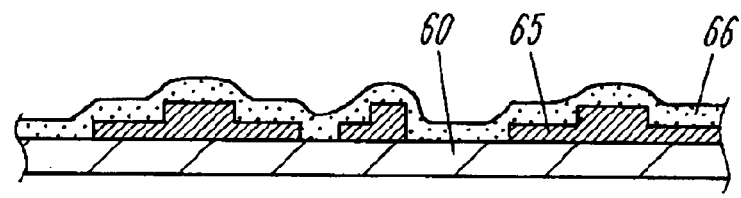
Figure 10C:
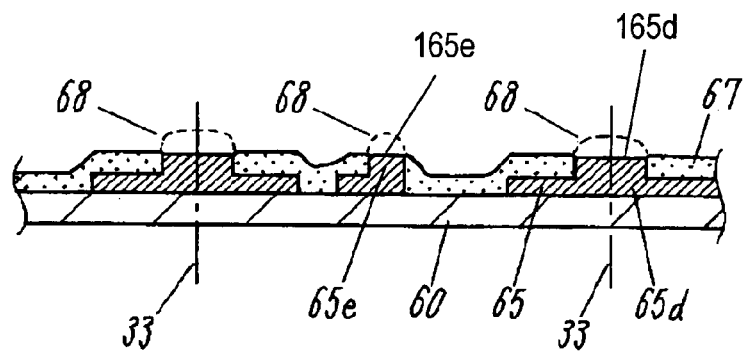

FIGS. 10A to 10C illustrate processes for forming the insulating layer at Step 27 shown in FIG. 1 for electrical and physical protection for conductor pattern 65 and substrate 60.

FIG. 10A is a cross sectional view of wafer 60c provided at Step 26 which includes substrate 60 and conductor patterns 65, 65e, and 65d on substrate 60. Conductor patterns 65d and 65e are provided by baking conductive paste 56 filled in electrode recesses 54c shown in FIG. 7. Conductor pattern 65 have portions 651 and 652 corresponding to portions 561 and 562 of conductive paste 56, respectively. Portion 652 of conductor pattern 65 is higher than portion 651 and is connected to portion 651.

Then, insulating paste, such as crystalline glass, is applied on upper surfaces of conductor patterns 65, 65d, and 65e and substrate 60, as shown in FIG. 10B. The insulting paste is then baked, thus providing insulator 66 of crystalline glass on substrate 60.

Then, insulator of insulator 66 on conductor patterns 65, 65d, and 65e is ground to allow upper surfaces 165d and 165e of conductor patterns 65d and 65e to expose, providing insulating layer 67. The insulating material of insulating layer 67 is not limited to glass and may be resin.

Then, substrate 60 having conductor patterns 65, 65d, and 65e and insulating layer 67 thereon is cut along border 33 at Step 28 shown in FIG. 1, dividing the substrate to provide chip substrates 32.

Figure 11:
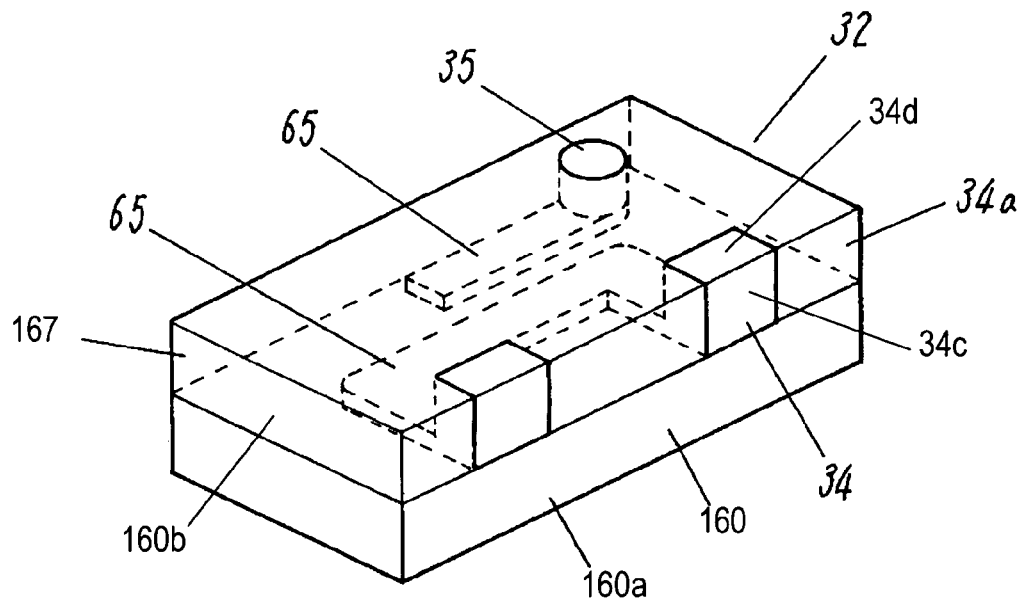
FIG. 11 is a perspective view of the electronic device according to Embodiment 1.

FIG. 11 is a perspective view of chip substrate 32, i.e., the surface-mount electronic device according to Embodiment 1. Chip substrate 32 includes substrate 160 and insulating layer 167 provided by dividing substrate 60 and insulating layer 67, respectively. Substrate 60 is cut at Step 28 shown in FIG. 1, and side surface 34c of side electrode 34 corresponding to a cut surface of conductor pattern 65d exposes. That is, side electrode 34 on side surface 34c is flush with side surface 160a of substrate 160 on the same plane. Conductor pattern 65d provides side electrode 34, and simultaneously to this, upper surface 34d of side electrode 34 is provided. Conductor pattern 65e provides upper electrode 35.

Since being formed by offset printing, an edge shape of conductor pattern 65 is more uniform, less varies, and is more stable than that of a pattern formed by etching. This allows conductor pattern 65 to provide an inductor having a stable, constant inductance, hence providing a high-frequency circuit having a high performance.

Conductor pattern 65 is led to side surface 34a of insulating layer 167 to provide side electrode 34 unitarily with conductor pattern 65. Side surface 34a of insulating layer 167 is flush with side surface 160a of substrate 160, and consequently, side electrode 34 exposes on the same plane as side surface 160a of substrate 160 and side surface 34a of insulating layer 167. Since side electrode 34 is provided unitarily with conductor pattern 65, a connection resistance between them is small. Further, since no process for forming the side electrode, the surface-mount electronic device is manufactured inexpensively.

Upper electrode 35 extends unitarily from conductor pattern 65 perpendicularly to upper surface 160b of substrate 160 having conductor pattern 65 provided thereon in chip substrate 32. Upper electrode 35 may be used as a ball grid array (BGA) terminal of a semiconductor device.

Side electrode 34 and upper electrode 35 are coated by nickel-tin alloy plating. Each of side electrode 34 and upper electrode 35 has a size of length of about 300 μm and a width of 60 μm.

Upper electrode 35 is formed unitarily with conductor pattern 65, similarly to side electrode 34, and hence, a connection resistance between them is small. The unitary forming eliminates an extra process for forming the upper electrode, thus allowing an inexpensive surface-mount electronic device.

Since side electrode 34 is not provided on side surface 160a of substrate 160, side surface 160a of substrate 60 is insulated.

An effect of suppressing deformation of conductive paste 56 deflected during the heating at Step 25 in the processes of manufacturing the surface-mount electronic device shown in FIG. 1 according to Embodiment 1 will be described.

Figure 12:
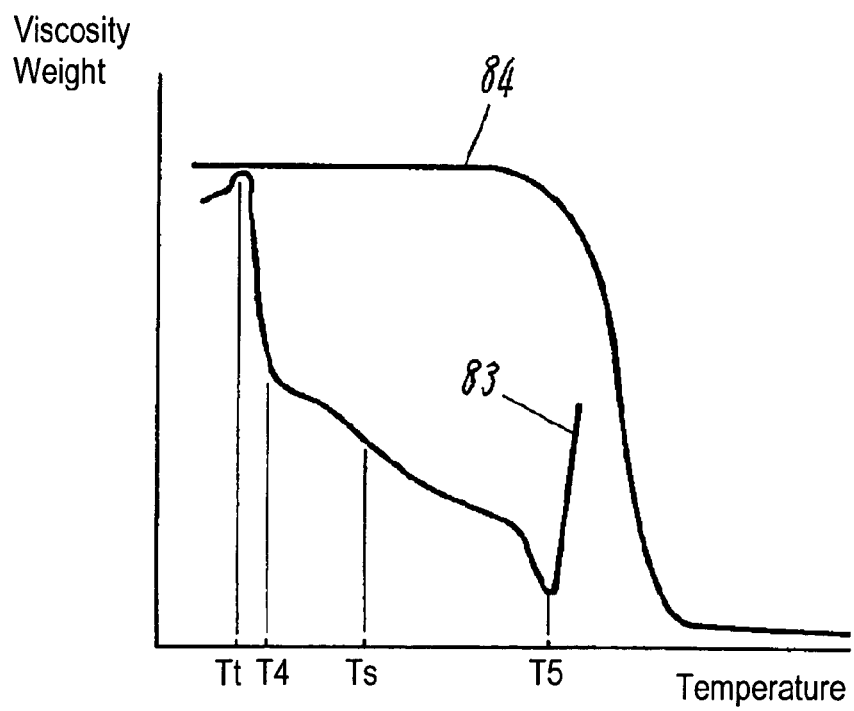
FIG. 12 illustrates characteristics of resin used in the method of manufacturing the electronic device according to Embodiment 1.

FIG. 12 illustrates the relationship between the temperature of the PVB resin in adhesive layer 61 and viscosity 83 of the resin and between the temperature and weight 84 of the resin. The horizontal axis represents the temperature and the vertical axis represents the viscosity and the weight.

Viscosity 83 of the PVB resin will be first explained. The PVB resin is heated from the room temperature to glass transition temperature Tt at Step 25, thereby having the viscosity of the resin decreasing. When the temperature rises to about temperature T4, the viscosity sharply decreases. When the temperature is temperature T5, the degree of polymerization of the PVB resin becomes zero, hence minimizing the viscosity. Then, the resin is heated at a temperature higher than temperature T5, the viscosity of the PVB resin increases. At temperature T5, most of the molecules of the PVB resin in the adhesive layer 61 remain as monomers. The PVB resin is heated at a temperature higher than temperature T5, thereby facilitating the decomposition of the PVB resin. The PVB resin accordingly decomposes into carbon molecules and gas, such as steam, and have the viscosity thereof increase.

Then, weight 84 of the PVB resin in adhesive layer 61 will be explained. At a temperature higher than temperature T5, hydrogen and oxygen in the PVB resin change into gaseous form, thereby decreasing weight 84 of the PVB resin sharply. If the heating at Step 25 is executed in the common atmosphere 25, its decomposition is facilitated by hydrogen and oxygen in the resin and oxygen in air. Temperature T5 is lower than a temperature for facilitating the decomposition in low-oxygen atmosphere, such as nitrogen atmosphere. That is, according to Embodiment 1, since substrate 60 is heated at Step 25 in the common atmosphere, the heating does not require expensive gas, such as nitrogen, and may be executed at low temperature 175° C., thus reducing energy to manufacture the electronic device.

Figure 13:
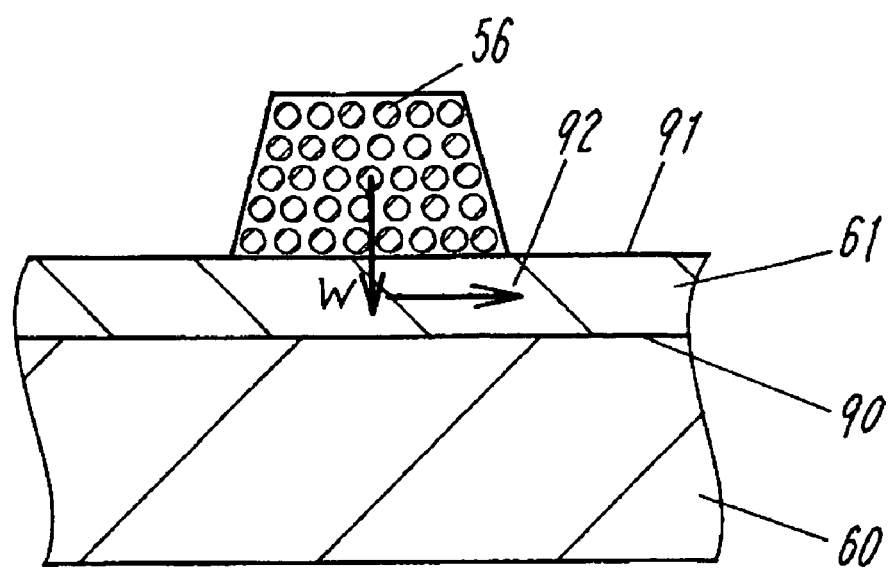
FIG. 13 is a cross sectional view of the electronic device for illustrating the method of manufacturing the device according to Embodiment 1.

FIG. 13 is a cross sectional view of substrate 60 at a temperature close to softening temperature Ts of the PVB resin shown in FIG. 12. Adhesive layer 61 of the PVB resin is heated, the resin expands in proportion to its temperature. When the temperature is raised to near softening temperature Ts, the PVB resin in adhesive layer 61 becomes liquid having a viscosity. Then, the PVB resin flows outward from substrate 60 in direction 92 due to thermal expansion. At this moment, the moving speed of the PVB resin is about zero at interface 90 between adhesive layer 61 and substrate 60, and increases as departing from interface 90. The moving speed becomes maximum at upper surface 91 of adhesive layer 61. Conductive paste 56 is located on the moving PVB resin in adhesive layer 61, thereby receiving a frictional force at the interface between adhesive layer 61 and paste 56. If the weight W of conductive paste 56 is small, the frictional force moves conductive paste 56 in direction 92. That is, a portion of conductive paste 56 which has small weight W, i.e., which has a small cross section, moves more. A thin portion of conductive paste 56 moves more than a thick portion of paste 56 thicker than the thin portion, conductor pattern 65 deforms after the heating and baking due to a difference between respective moving distances of the thin and thick portions.

The viscosity of the PVB resin sharply decreases at a temperature higher than the glass transition temperature Ts. The degree of polymerization of the PVB resin is minimum at a temperature near temperature T5. Therefore, in the heating at Step 25 according to Embodiment 1, the increase from temperature Ts to temperature T5 is reduced as much as possible.

The above operation reduces an expanding amount per time of adhesive layer 61, thereby reducing the moving speed of the PVB resin. The movement of conductive paste 56 is accordingly reduced, thus reducing the deformation of conductor pattern 65 and providing pattern 65 accurately.

Upon being heated to a temperature higher than temperature T5, the PVB resin in adhesive layer 61 has its molecular structure broken, and the broken structure does not recover to the original structure even upon being cooled down. That is, after degree of polymerization of the PVB resin becomes zero, and then the PVB resin is cooled, the viscosity of the PVB resin remains small even if being heated, hence preventing adhesive layer 61 from moving during the baking at Step 26. When adhesive layer 61 is heated at Step 25, then cooled down, and heated again at Step 36, the conductor pattern 65 does not deform at the baking at Step 26, hence being harmed accurately.

Figure 14A:
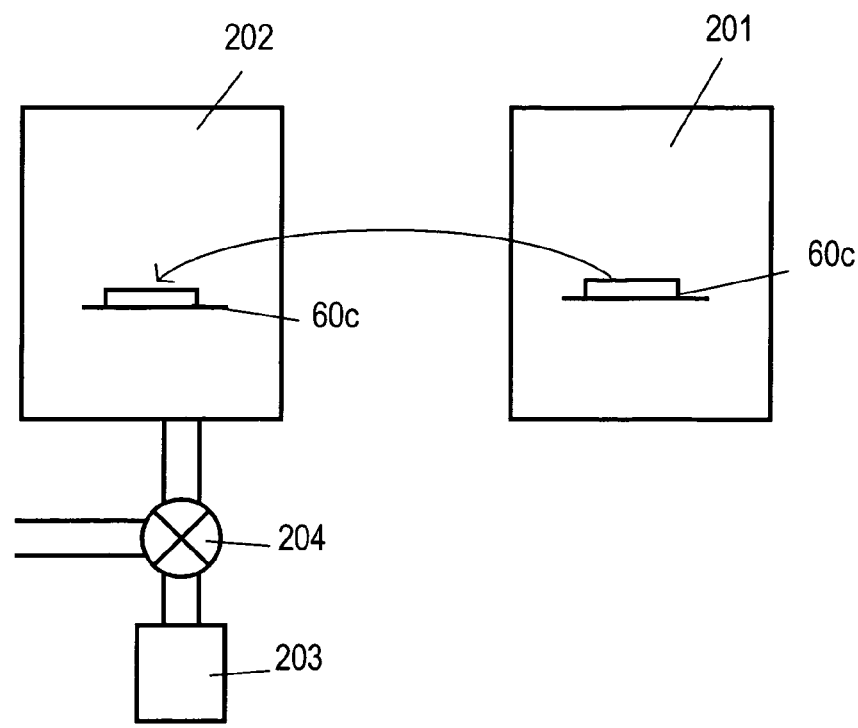
FIGS. 14A and 14B are schematic views of apparatuses for manufacturing the electronic device according to Embodiment 1.

The above advantage according to Embodiment 1 is useful particularly for conductive paste 56 made of copper powder. Since conductive paste 56 of copper powder has a resistance varying largely according to oxidization of copper, conductive paste 56 is generally heated in low-oxygen atmosphere, such as nitrogen atmosphere. FIG. 14A is a schematic view of an apparatus for manufacturing the surface-mount electronic device according to Embodiment 1. According to Embodiment 1, the temperature of substrate 60 may temporarily decrease between the heating at Step 25 and the baking at Step 26. As shown in FIG. 10A, the apparatus includes heating apparatus 201 for heating wafer 60c at Step 25 and baking apparatus 202, which is separate from heating apparatus 201, for baking wafer 60c at Step 26. Baking apparatus 202 may be connected with selector 204 for switching the atmosphere in of apparatus 202 between the atmospheric air and inactive gas, such as nitrogen gas, supplied from gas feeder 203. This arrangement allows the baking atmosphere in baking apparatus 202 to switch between the common atmosphere and the inactive gas atmosphere for baking wafer 60c at Step 26, hence baking conductive paste 56 of copper powder. Selector 204 may be implemented by a valve. Gas feeder 203 may be a gas container storing the inactive gas in liquid form.

Figure 14B:
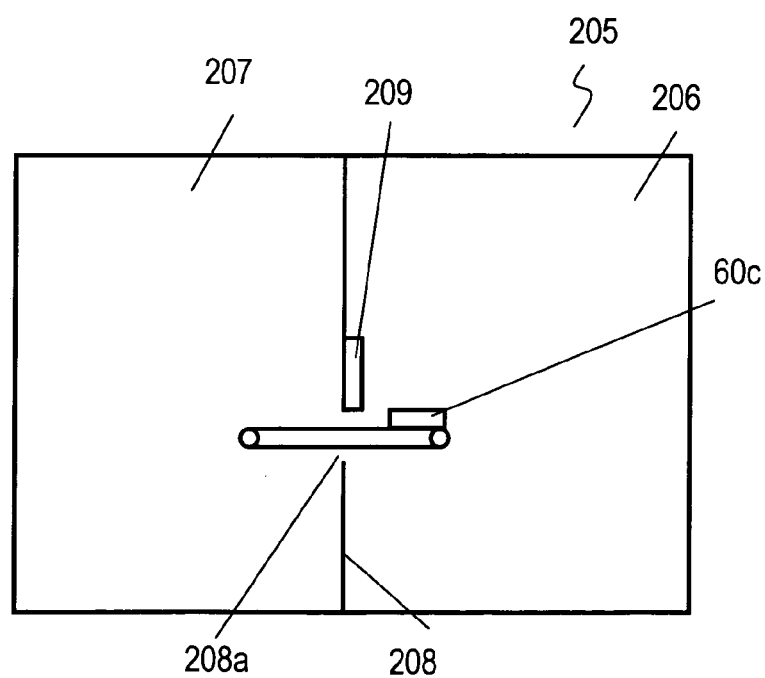

FIG. 14B is a schematic view of another apparatus for manufacturing the surface-mount electronic device according to Embodiment 1. Apparatus 205 includes heating chamber 206 corresponding to the heating apparatus 201 shown in FIG. 14A, baking chamber 207 corresponding to baking apparatus 202, and partition 208 for separating heating chamber 206 from baking chamber 207. Partition 208 has small aperture 208a for allowing wafer 60c to pass through the aperture. Aperture 208a in partition 208 may be closed with door 209. Apparatus 205 unitarily includes heating apparatus 201 and baking apparatus 202 shown in FIG. 10A, thereby reducing a space. Both the apparatuses shown in FIGS. 14A and 14B allow copper powder having a small resistance to be used in conductive paste 56, hence reducing a loss of signals in conductor pattern 65. An electronic device particularly employing conductor pattern 65 made of copper powder provides a high-frequency apparatus having excellent performance, such as NF.

Exemplary Embodiment 2

Figure 15:
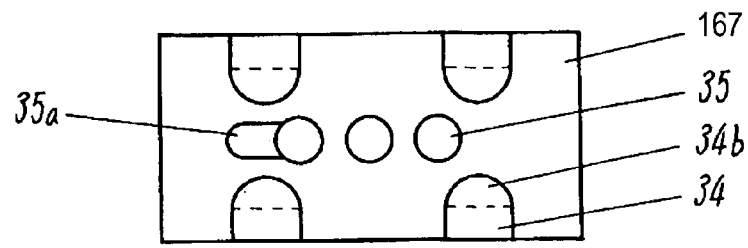
FIG. 15 is a plan view of a surface-mount electronic device according to Exemplary Embodiment 2 of the invention.

FIG. 15 is a plan view of a surface-mount electronic device according to Exemplary Embodiment 2 of the present invention. Upper surface 34d of side electrodes 34 exposes from surface 160b of substrate 160 perpendicularly to surface 160b. Extension electrode 34b connected to upper surface 34d is printed on insulating layer 167. This structure allows side electrode 34 to be led in the same direction in which upper electrode 35 faces, thus being connected with the outside easily. Further, extension electrode 35a connected to upper electrode 35 may be printed on insulating layer 167 for enlarging upper electrode 35.

Exemplary Embodiment 3

Figure 16:
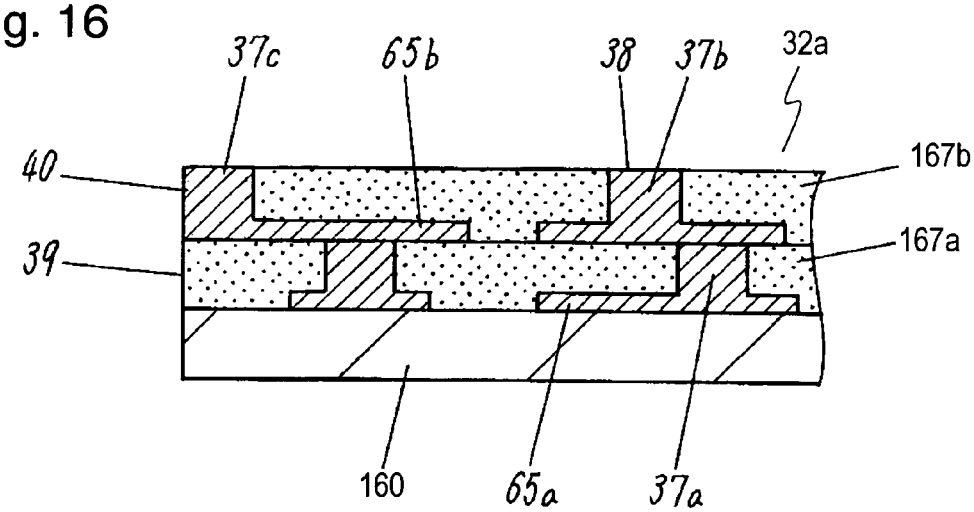
FIG. 16 is a cross sectional view of a surface-mount electronic device according to exemplary Embodiment 3 of the invention.

FIG. 16 is a cross sectional view of a surface-mountable electronic device according to Exemplary Embodiment 3 of the present invention. Conductor pattern 65a is provided on an upper surface of substrate 160. Conductor pattern 65a is formed by the same procedure as of Embodiment 1, and forms an electronic circuit. Insulating layer 167a is provided on substrate 160. Conductor pattern 65b is provided on an upper surface of insulating layer 167a. conductor pattern 65b is formed by the same procedure as of Embodiment 1 and forms the electronic circuit. Insulating layer 167b is provided on insulating layer 167a. Connector projection 37a formed unitarily with conductor pattern 65a electrically connects conductor pattern 65a on substrate 160 to conductor pattern 65b on insulating layer 167a. Connector projection 37a is formed by the same manner as conductor pattern 65e having upper surface 165e which exposes, as shown in FIG. 10C. Connector projection 37b formed unitarily with conductor pattern 65b provides upper electrode 38 on the upper side of insulating layer 167b, and, for example, allowing signals in conductor pattern 65b to be led from upper electrode 38.

Connector projection 37c exposes near side surface 39 of chip substrate 32a and functions as side electrode 40.

Upper electrode 38 and side electrodes 40 may be coated with nickel-tin alloy plating and provided with extension electrodes similarly to those of Embodiment 2. The surface-mount electronic device according to Embodiment 3 can have circuitry embedded therein densely.

Exemplary Embodiment 4

Figure 17:
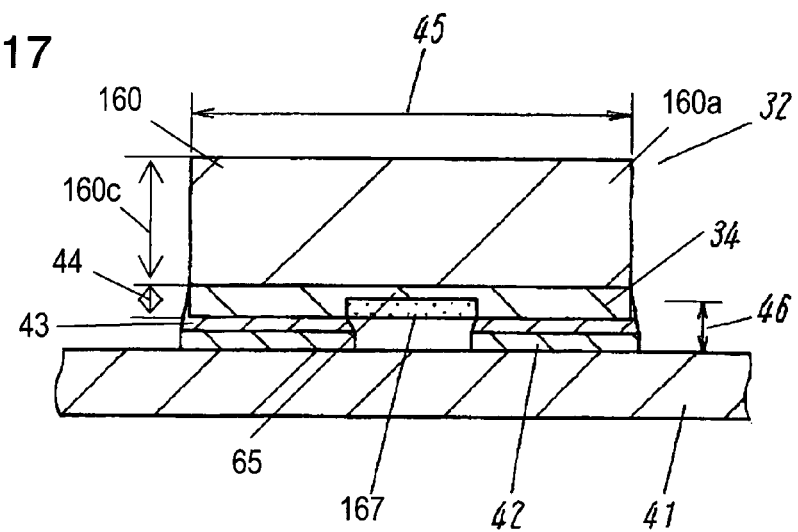
FIG. 17 is a cross sectional view of a surface-mount electronic device according to Exemplary Embodiment 4 of the invention.

FIG. 17 is a cross sectional view of a surface-mount electronic device (chip substrate 32) mounted on mother board 41 of an electronic apparatus according to Exemplary Embodiment 4. Land 42 is provided on an upper surface of mother board 41, and chip substrate 32 shown in FIG. 11 is mounted upside down on land 42. Side electrode 34 of chip substrate 32 is connected to land 42 with reflow solder 43, electrically-conductive joining member. As shown in FIG. 11, conductor pattern 65 is provided on substrate 160 of almina. Since side electrode 34 does not extend to substrate 160, height 44 of the electrode decreases by thickness 160c of substrate 160. This structure reduces the size of reflow solder 43, and thus, decreases installation area 45 of chip substrate 32, hence reducing the size the electronic apparatus including chip substrate 32.

Since distance 46 between conductor pattern 65 and mother board 41 can be small, the impedance of conductor pattern 65 can be reduced by grounding the upper surface or a lower surface of mother board 41. This arrangement protect chip substrate 32, i.e., the surface-mount electronic device according to Embodiment 4 from receiving noise from the outside.

Exemplary Embodiment 5

Figure 18:
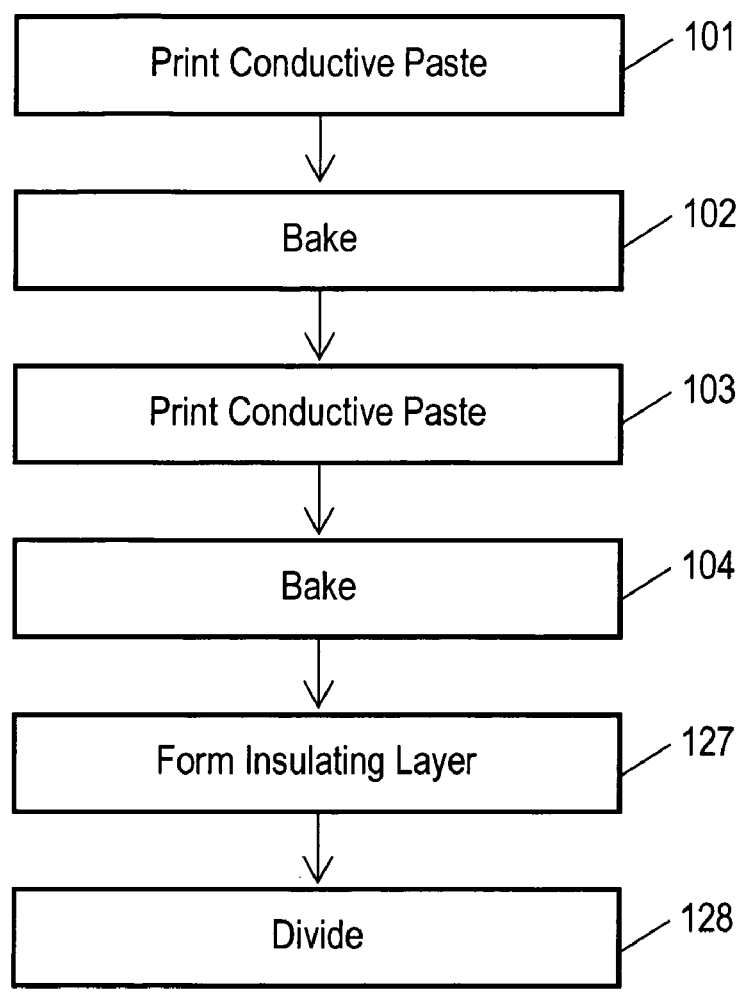
FIG. 18 illustrates processes in a method of manufacturing a surface-mount electronic device according to Exemplary Embodiment 5 of the invention.
Figure 19A:
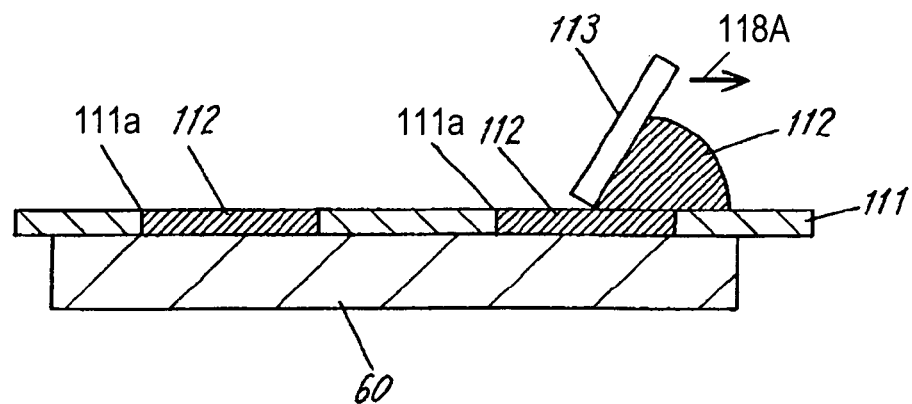
FIGS. 19A–19D are cross sectional views of the electronic device for illustrating the method of manufacturing the device according to Embodiment 5.
Figure 19B:
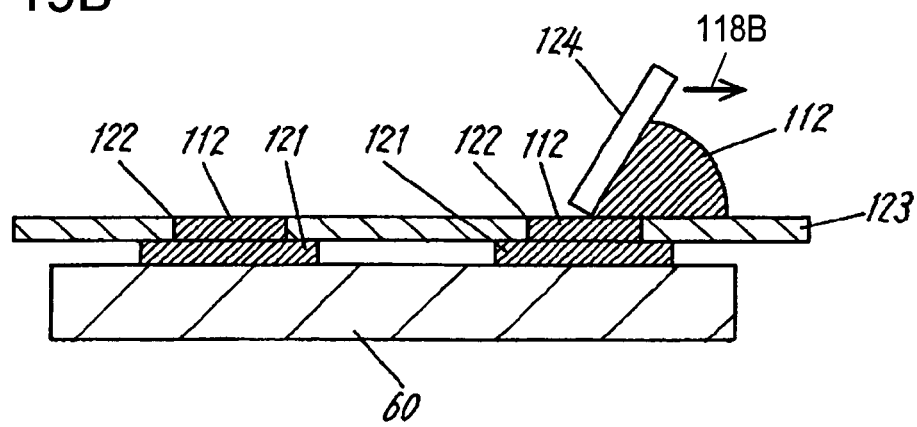
Figure 19C:
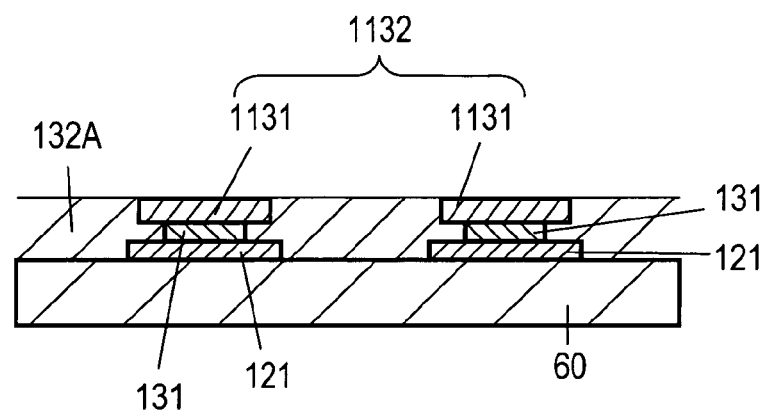
Figure 21A:
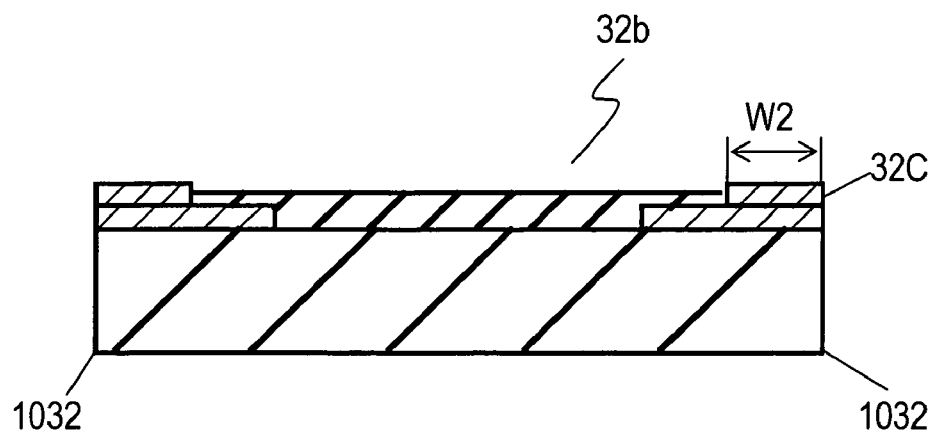
FIG. 21A is a cross sectional view of the electronic device according to embodiment 5.
Figure 21B:
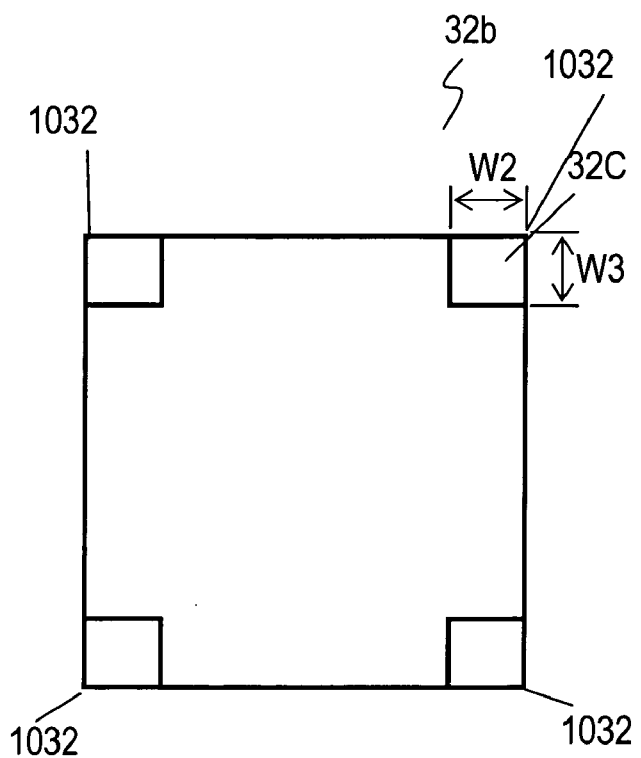
FIG. 21B is a top view of the electronic device according to embodiment 5.
Figure 22:
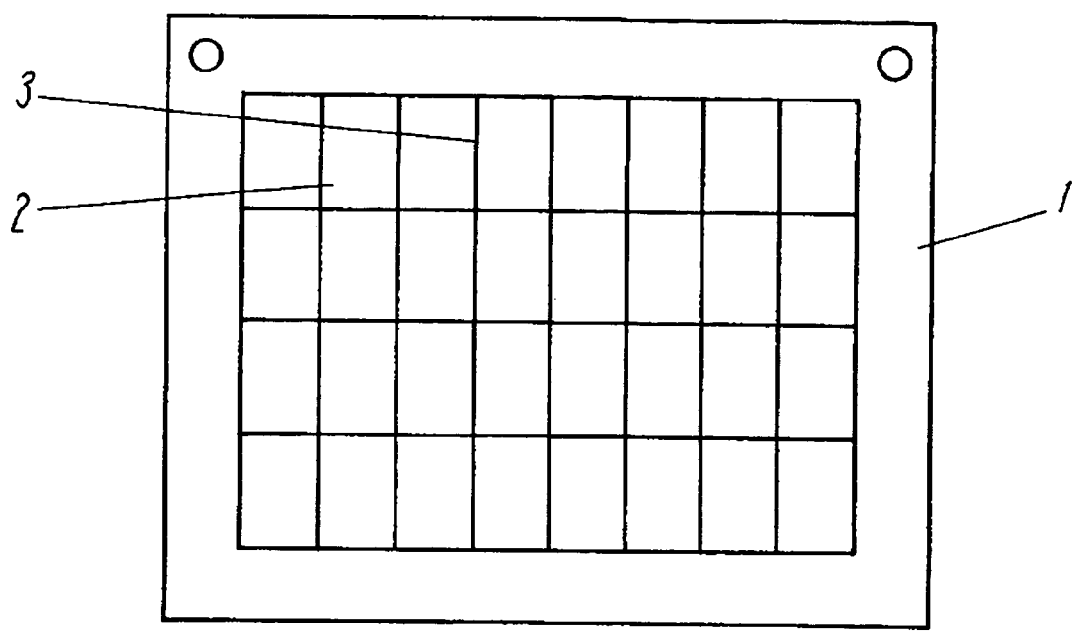
FIG. 22 is a plan view of a substrate for manufacturing a conventional surface-mount electronic device.

FIG. 18 illustrates processes in a method of manufacturing a surface-mount electronic device according to Exemplary Embodiment 5 of the present invention. FIGS. 19A to 19C are cross sectional views of the surface-mount electronic device for showing the method of manufacturing the device according to of Embodiment 5. FIG. 21A is a cross sectional view of the surface-mount electronic device according to Embodiment 5. FIG. 21B is a top view of the surface-mount electronic device according to Embodiment 5. Side Electrode 34 according to Embodiment 5 is form by screen printing according to Embodiment 5, while side electrode 34 shown in FIG. 15 is formed on a film 50 by intaglio printing in the method of manufacturing the device according to Embodiment 1.

As shown in FIG. 19A, metal screen 111 having aperture 111a therein is placed on alumina substrate 60. Conductive paste 112 containing silver and paradigm is applied onto the screen 111 and spread over with squeegee 113 moving in direction 118A on a surface of the screen 111. This operation fills aperture 111a in screen 111 with conductive paste 112. Then, screen 111 is removed, and conductive paste 112 having a predetermined shape is applied and printed on substrate 60 (Step 101). Conductive paste 112 provided at Step 101 is then baked (Step 102), providing conductor pattern 121 (FIG. 19B).

Then, screen 123 having aperture 122 smaller than aperture 111a of screen 111 is placed on conductor pattern 121, as shown in FIG. 19B. Aperture 122 is located on conductor pattern 121. conductive paste 112 is applied onto screen 123 and spread over with squeegee 124 moving in direction 118B on a surface of the screen 123. This operation fills aperture 122 in screen 123 with conductive paste 112. Then, screen 123 is removed, and conductive paste 112 is applied and printed on conductor pattern 121 so that conductor pattern 121 exposes (Step 103). Conductive paste 112 printed on conductor pattern 121 is then baked (Step 104), providing conductor pattern 131 (FIG. 19C). Screen 123 of Embodiment 5 has a thickness of about 40 μm, and conductor pattern 131 has a thickness of about 20 μm after the baking.

Figure 19D:
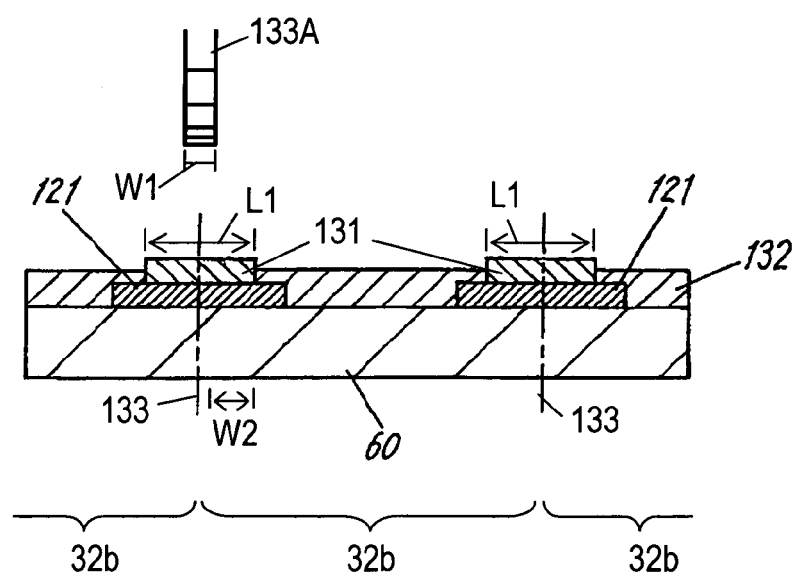

Then, mask 1132 having masking regions 1131 larger than conductor pattern 131 and smaller than conductor pattern 121 is placed on conductor pattern 131, as shown in FIG. 19C. Then, insulating paste 132A is applied through screen 1132. Insulating paste 132A is then baked and cured, providing insulating layer 132 on substrate 60 (Step 127), as shown in FIG. 19D. Insulating layer 132 is not provided on conductor pattern 131. That is, a surface of insulating layer 132 is lower than a surface of conductor pattern 131.

Figure 20:
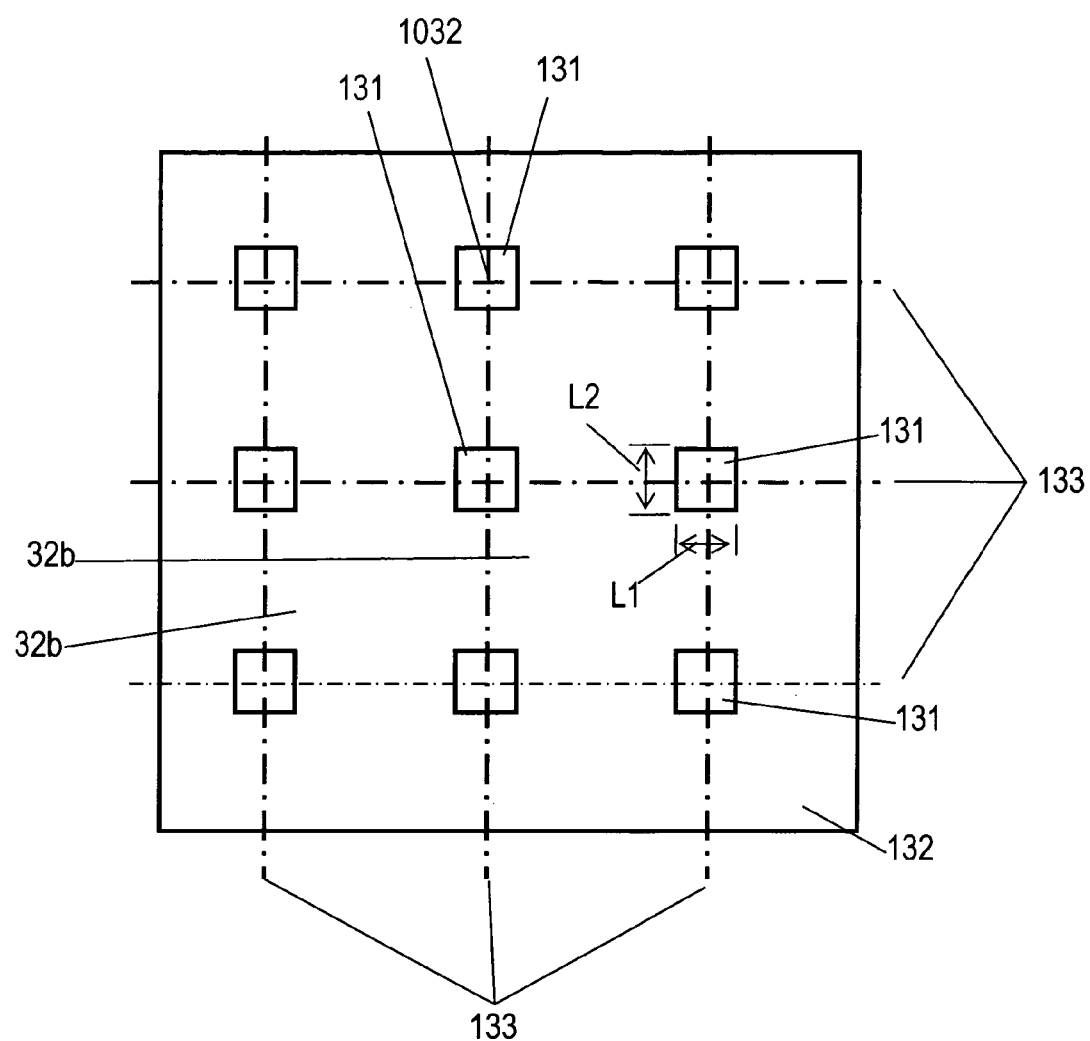
FIG. 20 is a top view of a substrate shown in FIG. 19D.

FIG. 20 is a top view of substrate 60 shown in FIG. 19D. Conductor pattern 131 exposing from insulating layer 132 has a rectangular shape having length L1 of 0.6 mm and width L2 of 0.5 mm.

Substrate 60 is then separated divided along border 133 extending across conductor pattern 131 (Step 128), and provides surface mount-electronic devices 32b shown in FIGS. 21A and 21B. Border 133 extends across substantially the center of conductor pattern 131. Substrate 60 is divided at Step 128 with rotary cutting blade 133A having a thickness W1 of about 0.2 mm. Cutting blade 133A accordingly provides a cutting loss of 0.2 mm, providing surface mount electronic device 32b having electrode 32c at each corner 1032 of the device. Electrode 32c has four-sided shape having length W3 of about 0.15 mm and width W2 of about 0.2 mm viewed from an upper viewpoint.

As above, the dividing at Step 128 provides side electrode 32c, and make another process of forming side electrode 32c unnecessary, providing inexpensive surface mount electronic device 32b.

Conductor pattern 131 to become side electrode 32c is provided by printing with screen 123, and thus is precisely shaped to have a size of length L1 of 0.6 mm and width L2 of 0.5 mm. This size allows side electrode 32c of surface mount-electronic device 32b to be soldered at a large area onto a mother board, thus increasing bonding strength between device 32b and the mother board.

Applying of conductive paste 112 at Steps 101 and 103 with screens 111 and 123, respectively, may be repeated to thicken conductor patterns 121 and 131. This operation simplifies the processes, thus providing further inexpensive surface mount electronic device 32b.

The mask used at Step 127 is thicker than a total of respective thicknesses of conductor patterns 121 and 131. This arrangement allows conductor pattern 131 to expose from insulating layer 132, thus ensuring the bonding strength between the side electrode 32c and the mother board.

In the processes of shown in FIG. 18 for manufacturing surface mount-electronic device shown, conductive paste 112 is baked to provide conductor pattern 121 at Step 102, and then, conductive paste 112 printed at Step 103 is baked at Step 103 to provide conductor pattern 131. Step 102 may be eliminated. That is, conductive paste 112 is printed with screen 123 on conductive paste 112 printed with screen 111 at Step 101. Then, conductive pastes 112 are baked together to provide conductor patterns 121 and 131, simultaneously.

What is claimed is:

1. An electronic device comprising:
   a substrate having an upper surface and a side surface;
   a first conductor pattern provided over the upper surface of the substrate, the first conductor pattern having a first portion and a second portion connected with the first portion, the second portion being higher than the first portion, the second portion exposing on a plane flush with the side surface of the substrate; and
   a first insulating layer provided on the first conductor pattern and over the upper surface of the substrate, the insulating layer having an upper surface and a side surface on the plane flush with the side surface of the substrate,
   wherein the second portion of the first conductor pattern contacts the substrate and the first insulating layer in the plane.

2. The electronic device according to claim 1, further comprising a second conductor pattern provided between the first insulating layer and the upper surface of the substrate, the second conductor pattern having a third portion and a fourth portion connected with the third portion of the second conductor pattern, the fourth portion exposing at the upper surface of the first insulating layer.

3. The electronic device according to claim 2, further comprising:
   a third conductor pattern provided on the fourth portion of the second conductor pattern and on the upper surface of the first insulating layer; and
   a second insulating layer provided on the third conductor pattern and on the upper surface of the first insulating layer, the second insulating layer having an upper surface and a side surface on the plane flushed with the side surface of the substrate.

4. The electronic device according to claim 1, wherein the second portion of the first conductor pattern exposes at the upper surface of the first insulating layer.

5. An apparatus comprising:
   a mother board having an upper surface;
   an electronic device including
      a substrate having an upper surface and a side surface,
      a conductor pattern provided over the upper surface of the substrate, the conductor pattern having a first portion and a second portion connected with the first portion, the second portion being higher than the first portion, the second portion having a first surface exposing on a plane flush with the side surface of the substrate, and
      an insulating layer provided on the conductor pattern and over the upper surface of the substrate, the insulating layer having an upper surface and a side surface on the plane flush with the side surface of the substrate, wherein the second portion of the first conductor pattern contacts the substrate and the first insulatmnn layer in the plane; and a land provided on the upper surface of the mother board and connected with the second portion of the conductor pattern.

6. The apparatus according to claim 5, wherein the second portion of the conductor pattern further has a second surface exposing at the upper surface of the insulating layer, wherein the land is connected with the second surface of the second portion of the conductor pattern of the electronic device, and wherein the mother board is provided over the upper surface of the insulating layer of the electronic device.

7. The apparatus according to claim 6, further comprising an electrically-conductive joining material connecting the land with the second surface of the second portion of the conductor pattern of the electronic device.

\* \* \* \* \*